United States Patent [19]
Walker

[11] Patent Number: 5,145,809
[45] Date of Patent: Sep. 8, 1992

[54] FABRICATION OF GUNN DIODE SEMICONDUCTOR DEVICES

[75] Inventor: David K. Walker, Greenfield, Mass.

[73] Assignee: Millitech Corporation, South Deerfield, Mass.

[21] Appl. No.: 622,057

[22] Filed: Dec. 4, 1990

[51] Int. Cl.[5] .................. H01L 21/302; H01L 21/329
[52] U.S. Cl. ..................... 437/203; 437/133; 437/228; 437/904; 437/184; 148/DIG. 135; 357/3; 156/654
[58] Field of Search ............... 437/974, 133, 203, 904, 437/228, 184; 148/DIG. 135; 357/67, 3, 68; 156/654

[56] References Cited

U.S. PATENT DOCUMENTS

| | | | |
|---|---|---|---|
| 3,959,037 | 5/1976 | Gutierrez et al. | 437/974 |
| 3,963,537 | 6/1976 | Kniepkamp et al. | 148/DIG. 135 |
| 3,981,073 | 9/1976 | Dully | 437/974 |
| 4,596,070 | 6/1986 | Bayraktaroglu | 148/DIG. 135 |
| 4,832,761 | 5/1989 | Geissberger et al. | 148/DIG. 135 |
| 4,879,250 | 11/1989 | Chan | 437/3 |

OTHER PUBLICATIONS

C. B. Cooper III, S. Salimian, M. E. Day, "Dry Etching for the Fabrication of Integrated Circuits in III-V Compound Semiconductors", *Solid State Technology*, pp. 109-112, Jan., 1989.

S. J. J. Teng, "Indium Phosphide Devices on Gallium Arsenide Substrates," *Microwave Journal*, Dec. 1985, pp. 138-140.

D. K. Ferry, "Gallium Arsenide Technology," section 6.6.5, pp. 214-217, Howard W. Sams & Co., Inc., (1985).

"VLSI Electronics Microstructure Science," vol. 11, edited by N. G. Einspruch and W. R. Wisseman, Academic Press, 1985, pp. 88-90 and 109-114.

J. C. Chen, C. K. Pas, D. W. Wang, "Millimeter-Wave Monolithic Gunn Oscillators," *IEEE 1987 Microwave and Millimeter-Wave Monolithic Circuits Symposium*.

Fank, Crowley and Hang, "First InP Gunn Sources Put the Heat on GaAs," *Microwaves & RF*, pp. 129-131, (Jul. 1985).

"Manufacturing Methods and Technology for Millimeter-Wave Inp Gunn Devices at 56 and 94 GHz," *Research and Development Technical Report DELET-TR-82-C-0386*, Mar. 1989.

S. M. Sze, "Physics of Semiconductor Devices," chapter 11, (John Wiley & Sons).

T. S. Laverghetta, "Solid-State Microwave Devices," section 4.4, (Antech House).

*Primary Examiner*—T. N. Quach
*Attorney, Agent, or Firm*—Pennie & Edmonds

[57] ABSTRACT

An improved method for manufacturing a semiconductor device is described. In the preferred embodiment, a Gunn diode is manufactured from InP active and buffer layers. The buffer layer is deposited on a GaAs substrate using an epitaxial deposition process and the active layer is deposited onto the buffer layer. Electrical connection to the InP layers is made by etching a via through the GaAs substrate and metallizing the walls of the via. After the device has been placed in its final package, the GaAs substrate material is removed. As a result, good thermal and electrical contact is made to the InP active layer, and therefore, a Gunn diode manufactured according to this invention can reliably produced greater output power.

24 Claims, 11 Drawing Sheets

FABRICATION OF GUNN DIODE SEMICONDUCTOR DEVICES

FIELD OF THE INVENTION

This invention relates generally to fabrication of semiconductor devices. More particularly, this invention relates to fabrication of semiconductor devices, such as Gunn diodes, using one semiconductor material as a substrate and another semiconductor material as an active layer, or using one semiconductor material as an active layer and another semiconductor material as an etch-stop layer between the active layer and a substrate.

BACKGROUND OF THE INVENTION

A "Gunn diode" is a semiconductor device extensively employed in microwave and millimeter wave sources because of its property of oscillating at high frequencies. Gunn diodes are manufactured from semiconductor materials that are known to exhibit the transferred electron effect, which gives rise to a negative differential resistivity occurring in bulk semiconductor material (i.e. not at a junction) when a voltage, which is at least equal to the threshold voltage for a given material, is applied to a properly prepared sample of such material. The transferred electron effect, also known as the Gunn effect, can be used to produce a frequency of oscillation inversely proportional to the time it takes for an electron to cross a sample of such semiconductor material.

The Gunn effect is found in so-called III-V compound semiconductors which comprise combinations of Ga, In, and Al from group III of the periodic table of elements, and P, As, and Sb from group V. Of these materials, Gallium Arsenide (GaAs) has been the most highly developed for commercial applications because this material is relatively easy to work with. However, Indium Phosphide (InP) is known to have superior electronic properties that are especially advantageous for high-frequency millimeter-wave applications. Although, in theory, InP Gunn diode oscillators can be made to produce higher output power at higher frequencies than GaAs devices, InP has not been widely employed in commercial-scale devices due to its poor mechanical properties such as low thermal metallurgical interface stability, poor mechanical strength, and problems associated with its processing.

More specifically, a typical Gunn diode fabrication process includes growing a crystalline substrate of the desired semiconductor material and then growing additional layers, doped appropriately, onto the substrate. The substrate is used as a foundation upon which many thousands of individual devices are grown. The devices are ultimately cut apart, and, in this process, most of the substrate material is destroyed. This process is not readily adaptable to fabrication of InP devices because, in part, InP substrates show a tendency to decompose at high temperatures which are employed during material growth. In addition, InP is more expensive than GaAs and since the substrate material is largely discarded, devices that are grown on InP substrates cannot compete cost-effectively with GaAs devices on a per-area basis. Another problem associated with fabrication of InP devices is that device contacts are difficult to attach because the preferred contact attachment techniques involve ultrasonic bonding processes that may cause the fragile InP substrate to fracture and be destroyed.

Presently, the design of commercial InP Gunn diodes is essentially analogous to traditional GaAs Gunn diode design, which dates back about 20 years. A critical step in the fabrication of such devices involves precision thinning of the InP substrate to a thickness of around 10 $\mu$m in order to create a more uniform current density and electric field profile in the active layer. For efficient very high frequency operation, such as 140 GHz, consideration of the skin effect necessitates a uniform substrate thickness of about 5 $\mu$m. The substrate thinning operation is a complicated and expensive process. Furthermore, commercial InP Gunn diodes, as well as experimental devices reported in the literature, typically employ a plated heat sink geometry. However, extensive device modeling has shown that a flip-chip style device, also referred to as an Ultrasonic Thermo-Compression (UTC) bonded device in the literature, wherein the thin-metalized cathode is UTC bonded face-down directly to the package stud, without a large integral plated heat sink, provides a lower overall thermal resistance. Such flip-chip structures cannot be used with the conventional InP diode design because, as indicated, a very delicate semiconductor layer left after the precision thinning process cannot withstand the mechanical stresses induced during the ultrasonic die bonding process used for manufacturing flip-chip devices.

The present state of the art in design and manufacturing of the InP gunn diodes is disclosed in J. Crowley et al., "Manufacturing Method and Technology Project for Millimeter-Wave InP Gunn Devices at 56 and 94 GHz," Research and Development Technical Report DELET-TR-82-C-0386, which discloses the research efforts of the leading manufacturer of InP devices. On page 18, the report indicates that the integrated heat sink (IHS) style device is the only known practical InP Gunn device configuration, although other configurations may provide a lower thermal resistance in the device. Also, on the same page, the report indicates that in a traditional device, the fragile nature of InP mesas precludes ultrasonic-thermocompression bonding during a high-yield process. Further, on page 23, the report indicates that a key factor in fabricating the highest efficiency device is the reduction of parasitic resistance, which is, at least partially, due to DC and skin effect resistance of the substrate material of the conventional device. According to the research results set forth in the report, the best approach to minimizing the series resistance is eliminating as much of the substrate material as possible.

The above discussion demonstrates that it is desirable to avoid the use of an expensive and fragile InP substrate material during device manufacture. Also, it is desirable to produce a diode structure in which the electrical resistance and power dissipation due to the substrate layer is eliminated or substantially reduced.

InP epitaxial layers can be grown on a GaAs substrate using vapor phase epitaxy and the electronic characteristics of InP layers can be controlled by doping with sulphur or other elements. See, Teng, "InP Devices on GaAs Substrates" *Microwave Journal*, December 1985, pp. 138-140, incorporated herein by reference. The Teng article does not teach the steps necessary to form a useful device. According to Teng, a device would necessarily include a GaAs substrate with InP layers formed thereon. This would preclude use of a layer of metallization to create contacts on both sides of the InP layers and, therefore, the GaAs substrate would be part of the thermal and/or electrical path from the active InP region to one of the device contacts and would contribute to the parasitic electrical and thermal resistance in the device. Since GaAs is not a good conductor of heat, such devices may have limited thermal dissipation capability and thus limited power handling capacity.

Thus, while the art indicates that formation of InP epitaxial layers on GaAs substrates is possible, the art does not teach a useful method of manufacturing InP devices using GaAs substrates. The art does not teach a method that allows for manufacture of Gunn diodes which do not contain an effective substrate layer and thereby provide a more direct electrical connection to the active layer. Furthermore, an improved electrical connection to the active layer is also desirable in conventional GaAs Gunn diodes, which contain a GaAs substrate layer.

SUMMARY OF THE INVENTION

The present invention provides a cost-effective method of manufacturing Gunn diodes and other semiconductor devices, which can reliably produce greater output power at higher frequencies. While the method of the preferred embodiment of the invention is applicable to formation of InP Gunn diodes using a layered structure wherein InP layers are grown on a GaAs substrate, the method of the invention has applicability to formation of Gunn diodes using active materials other than InP and substrates other than GaAs. Furthermore, the method of this invention is applicable to the manufacture of semiconductor devices other than Gunn diodes.

In the preferred embodiment, an InP-GaAs heterojunction is created by depositing an epitaxial InP buffer layer on a GaAs substrate. An InP active layer is then grown over the buffer layer. Following epitaxial growth, the substrate material is thinned appropriately. Next, a "via", which extends through the substrate to the buffer layer, is etched in the substrate material. Vias, which are passageways formed through layers of planar material, can be successfully formed in GaAs using various dry etchants. See Cooper et al., "Dry Etching for the Fabrication of Integrated Circuits in III-V Compound Semiconductors", *Solid State Technology*, January 1989, pp. 109-112, incorporated herein by reference, where a technique is described for making through-the-wafer connections in order to improve device packing density. There is no suggestion in this article that this technique might be useful in the formation of a discrete Gunn diode device itself or another similar discrete semiconductor device. Also, D. K. Ferry, "Gallium Arsenide Technology," 1985, Chapter 6, Section 6.6.5, describes the common use of via holes to provide an electrical ground for a microstrip or coplanar circuit formed on semi-insulating GaAs. However, this publication does not suggest that the same or similar technique is applicable to discrete Gunn diode fabrication or fabrication of another similar discrete semiconductor device.

Next, in the preferred embodiment, the surfaces of this layered structure are metalized, including the substrate surface extending inwardly along the walls of the via, such that the exposed portion of the buffer layer is also metalized. Thus, a metallization layer is created that comprises two planar portions, which are spaced apart and connected by a connecting portion. The metalized surface of the substrate is a foundation for bonding a device contact lead and the metalized via surface provides a direct electrical connection to the buffer layer. During contact bonding, the GaAs substrate provides mechanical support for the InP layers. The GaAs substrate is ultimately removed from the structure using a suitable selective chemical etchant, and a Gunn diode, which consists of InP layers with appropriately attached metal contacts, is formed. This diode structure provides good heat conduction away from both sides of the InP active layer because metal contacts are attached directly to the InP active and buffer layers, without an intermediate substrate layer. Consequently, such devices can accommodate high power levels. Furthermore, this device structure eliminates the electrical resistance and power dissipation due to the intermediate semiconductor substrate layer which is present in a conventional device. Also, the crucial fabrication step wherein the device active area is defined is significantly simplified. According to this invention, the device active area is established during the via hole dry etching process, which is far more controllable and reproducible than the conventional wet chemical etch processes used in Gunn diode production of the current art.

Finally, the resulting device structure offers two further electrical advantages over the conventional designs. The parasitic inductance, as well as the angular position-dependent RF performance typically observed with conventional devices due to the bonding wires, ribbons, or cross-shaped preforms, is reduced. This is especially true if the via is circularly symmetric with respect to the vertical axis passing through the center of the device, and the device is packaged such that the depth of the via is approximately the same as, or longer than, the resulting length of any wires, ribbons, or metal preforms used to connect the flat top of the metallization of the via to the package top (typically the flat surface of an alumina or quartz ring in a conventionally packaged Gunn device).

In an alternative embodiment, the method of this invention is also applicable to fabrication of improved Gunn diodes, or other semiconductor devices in which the same or similar semiconductor material is utilized for the active layer and the substrate. For example, in a GaAs Gunn diode an etch-stop layer, preferably of $Al_xGa_{1-x}As$ (see Cooper et al., op cit.) that separates the GaAs substrate from the GaAs active and/or buffer layers is grown in the layered structure. The etch-stop layer and other layers of the structure have different etch rates with respect to a particular etchant, so that a via which extends to the etch-stop or buffer layer can be formed in the material of the device. In the resultant device, the via is metalized to provide an improved electrical and thermal connection to the active layer, and to improve the power output of the device. The devices manufactured according to this alternative embodiment offer superior performance in comparison to conventional Gunn devices, although the simplified removal of the substrate material around the via hole provided in the preferred embodiment is not available in this case.

As indicated the elimination of an effective substrate layer in the device structure would also improve the performance of semiconductor devices other than Gunn diodes, for example, such devices as Impact Avalanche Transit Time (IMPATT) diodes, Varactor diodes, Schottky diodes, or three-terminal devices such as Field Effect Transistors, Heterojunction Bipolar Transistors, and High Electron Mobility Transistors.

BRIEF DESCRIPTION OF THE DRAWINGS

The invention will be better understood if reference is made to the accompanying drawings (not drawn to scale) which schematically illustrate the devices of several embodiments of the invention in successive stages of manufacture, in which.

DESCRIPTION OF THE PREFERRED EMBODIMENTS

The successive stages of manufacture of the device of the preferred embodiment of the invention are discussed in relation to FIGS. 1 through 4.

Figure 1:
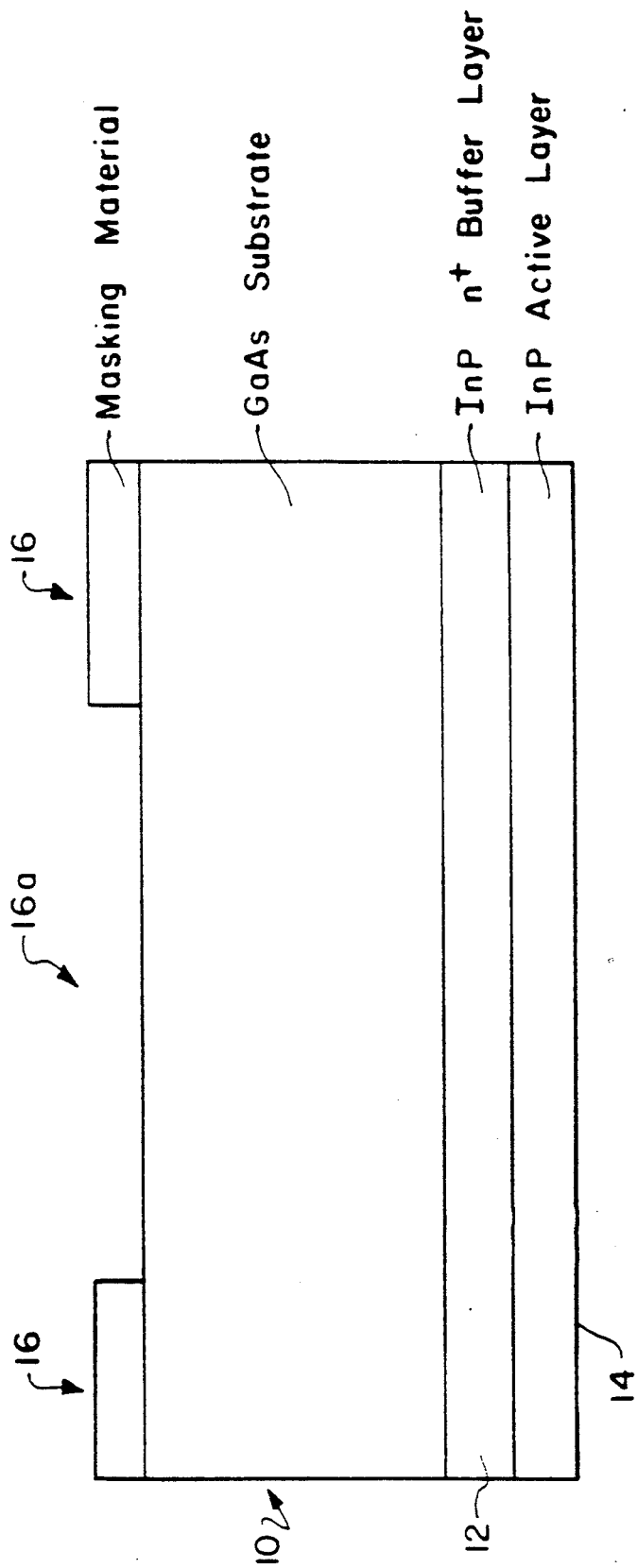
FIG. 1 is an illustration of a GaAs-InP layered structure with masking material.

FIG. 1 shows a layered structure which is formed at the first step in manufacturing of the Gunn diode according to the invention. This structure includes a GaAs substrate 10 with n+ doped InP buffer layer 12 and n doped InP active layer 14 deposited on it. The InP layers are epitaxially grown using the teaching of the Teng article referred to above, or other known teachings. Following the epitaxial growth, either mechanical or chemical lapping/etching, or a combination thereof, is employed to thin the substrate to a thickness of approximately 100 $\mu$m. This process is within the skill of the practitioner in this field and is used for conventional GaAs Gunn Device processing.

As mentioned previously, the reference herein to GaAs as substrate material and to InP as active and buffer layers should be understood to include reference to other combinations if and when their use becomes desirable. Also, it should be noted, that the method described herein is applicable to different device configurations, including devices wherein an active layer 14 is directly deposited onto the substrate 10 without an intermediate buffer layer 12. Furthermore, the method of this invention can be applicable to devices other than Gunn diodes. For example, this method can be employed in manufacturing of IMPATT diodes, Varactor diodes, Schottky Barrier diodes, or transistors of various types.

The active layer 14 is the portion of the structure in which the Gunn effect actually occurs. The thickness and the extent of doping of the active layer 14 0 determines the operating frequency of a device. For example, in one embodiment, to achieve 94 GHz operating frequency, an approximately 1.5 $\mu$m thick active layer doped to a carrier concentration of approximately $5 \times 10^{15}$ to $10^{16} cm^{-3}$ is required. The n+ buffer layer 12 is used to protect the active layer 14 from any potential contamination that can occur due to the epitaxial layer interface with the surface of the substrate 10 and to provide some mechanical support for the active layer 14. Such n+ buffers are conventionally employed in the art. The GaAs substrate 10 provides the correct crystal structure which is necessary for epitaxially depositing InP layer 12. An approximately 4% mismatch in lattice constants between the GaAs substrate 10 and the InP buffer layer 12 does not preclude formation of the InP-GaAs heterojunction. Furthermore, the method of this invention is applicable to other substrate materials, such as silicon. For example, epitaxial growth of GaAs on silicon substrates is within the skill of the art.

Therefore, a relatively inexpensive GaAs material can be used as a substrate, while providing InP material or another material that has the proper crystal structure for the active layer of the device. Also, as described below, the GaAs substrate 10 provides mechanical support for the device during manufacture. The assembly of the device depicted in FIG. 1 is completed by a layer of a masking material 16, such as a patterned photoresist (a photosensitive polymer film conventionally used in the photolithography art for selective etching) or silicon dioxide. Following known steps, selected areas of the photoresist 16 are removed such that holes 16a in the photoresist define the locations of devices to be formed on the layered structure consisting of the GaAs substrate 10 and InP layers 12 and 14.

Figure 2:
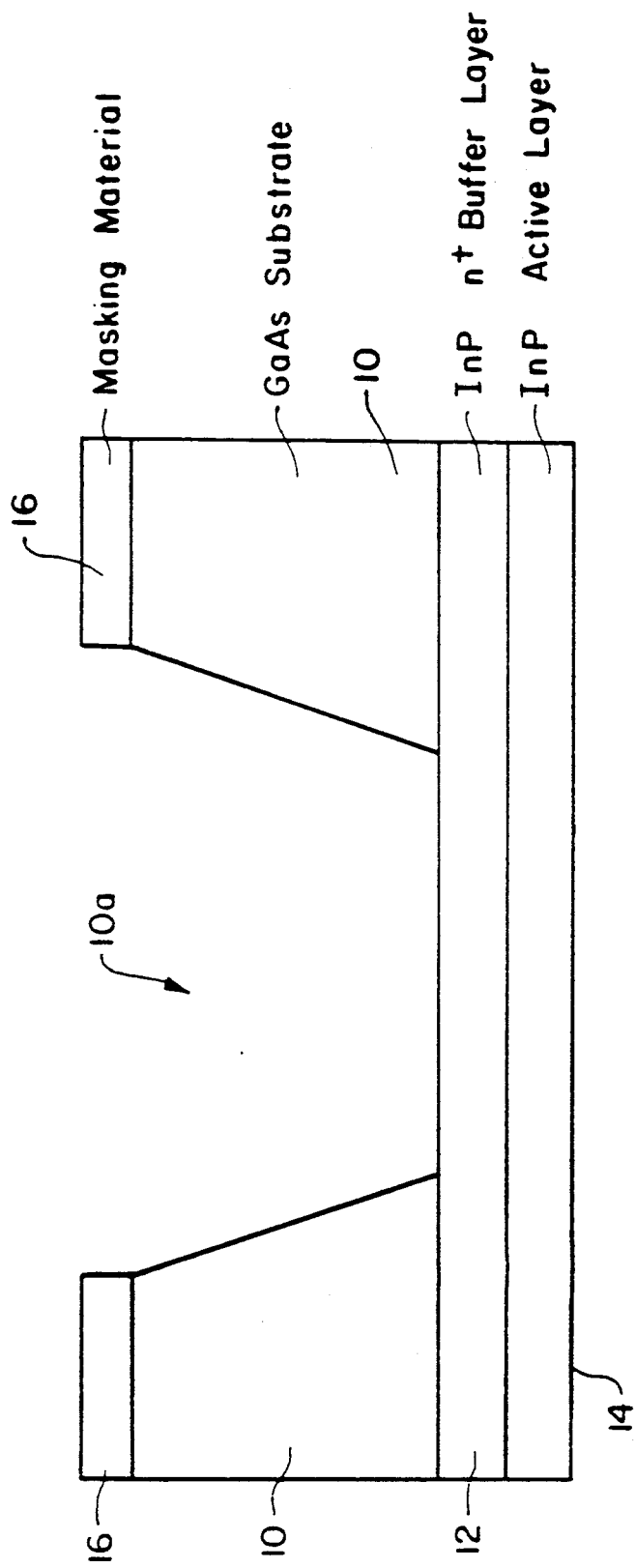
FIG. 2 is an illustration of the layered structure of FIG. 1 after etching a via through the substrate.

FIG. 2 illustrates the result of the second step in manufacture of a semiconductor device according to the preferred embodiment of the invention. In this step, the GaAs substrate material is etched away using a reactive ion etch process as disclosed in the Cooper et al. paper discussed above and incorporated herein by reference. The result of the etching process is that a via 10a is formed in the substrate 10 under the hole 16a in the photoresist such that the n+ buffer layer 12 is exposed at the bottom of the via. This is made possible because the etch rates of the InP buffer layer 12 and the GaAs substrate 10 are very different for certain chemical etchants. A chlorine-based etchant can be employed very efficiently to remove GaAs, while the InP is essentially undisturbed. Also, etchants containing fluorine may be useful for this purpose. This etching process should be monitored in order to cease etching when the via is essentially complete, so that the characteristics of the InP layer 12 are not adversely affected. In another embodiment, depending on the exact combination of substrate and active layer materials employed, various other etchants may be employed. Also, a wet etching process may be employed if a liquid solution, which has widely differing etch rates with respect to substrate and active material, is used. However, for a wet etchant, the advantage of easily defining the device active area may be lost, due to the often isotropic nature of wet chemical etches as compared to the more anisotropic nature possible with dry etches.

Figure 3:
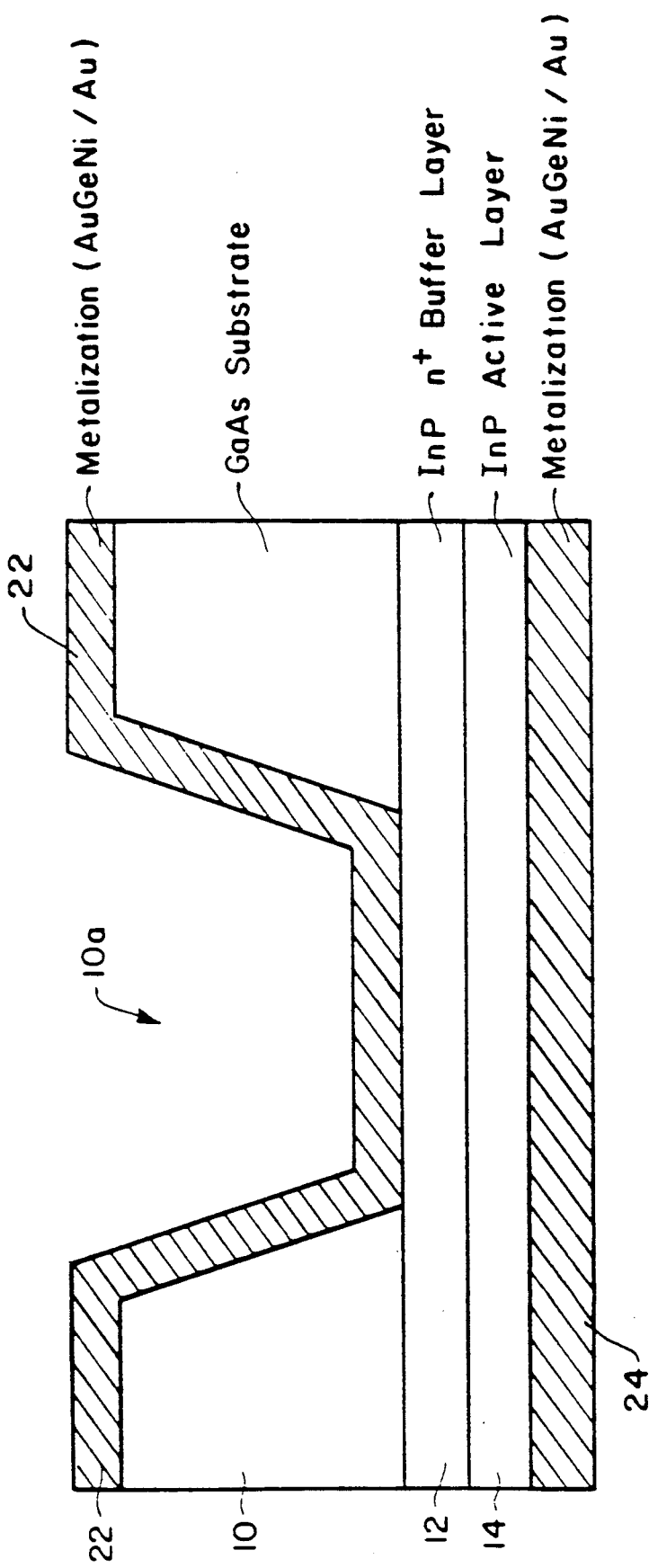
FIG. 3 is an illustration of the layered structure after removing masking material and coating the surfaces of the structure with metallization material (not drawn to scale)

As shown in FIG. 3, after the via 10a is formed and the remaining photoresist layer is removed, the next step is metallization of both sides of the structure. The metallization layer can be a conventional metallization material, such as AuGeNi with or without an additional Au layer formed thereupon, and it can be deposited using conventional techniques. As a result, the via 10a is coated with a thin layer of metallization indicated as 22, which ultimately provides the contact to the buffer layer 12. The surface of the InP active layer 14 is also coated by the metallization layer and is indicated as 24. Metallization layer 24 becomes the contact between the InP active layer 14 and a package stud in a flip-chip device configuration. Electrical contacts to active layer 14 and buffer layer 12 are made through these layers by alloying the corresponding metallization layers 22 and 24 using one of the conventional heating techniques employed for alloying metals to semiconductor materials. As indicated in FIG. 3, at this stage, the GaAs layer 10 is still part of the layered structure.

Figure 4:
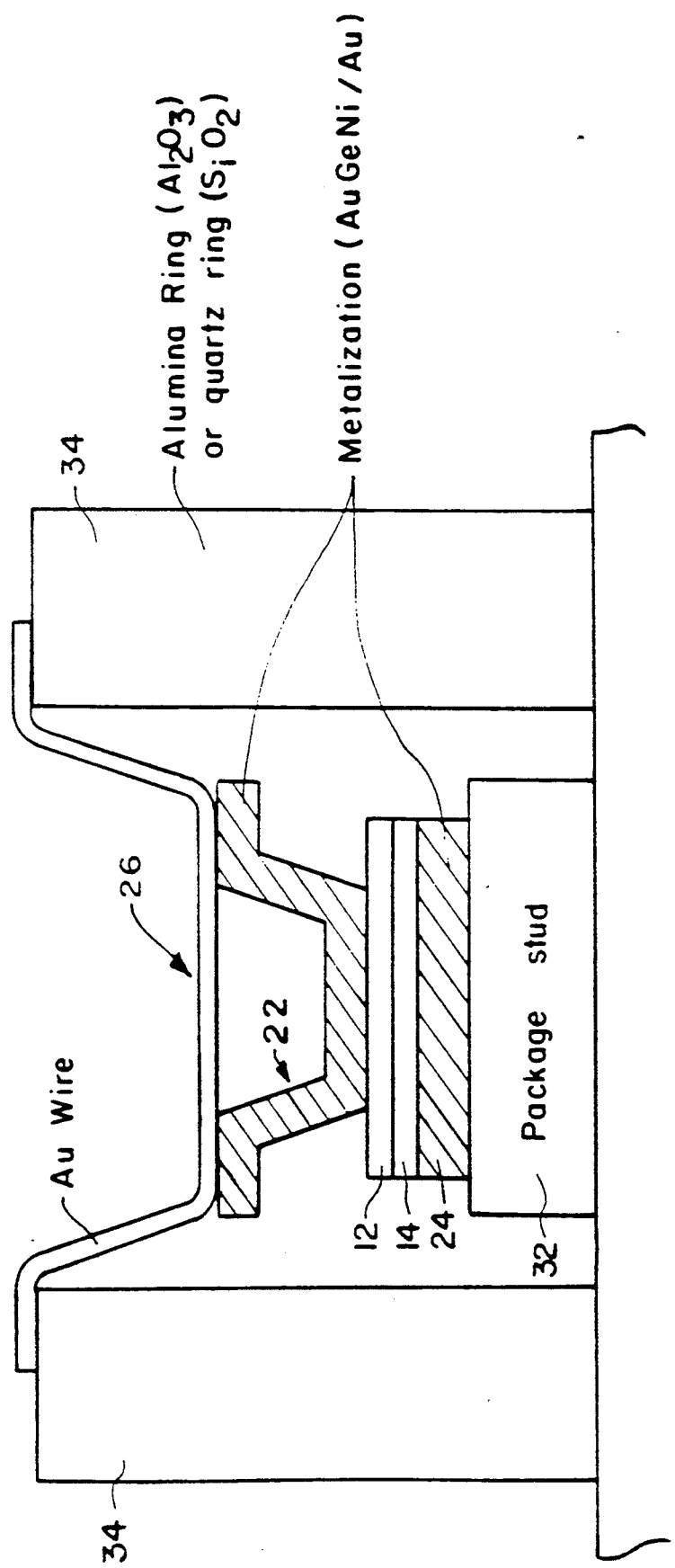
FIG. 4 is an illustration of a Gunn diode manufactured according to the invention and packaged as a flip-chip.

The above steps can be carried out on a semiconductor wafer, where hundreds or thousands of devices are formed simultaneously and identically. After metallization, the wafer is cut, or scribed and broken, into dice, and, typically, the individual devices are placed into packages. FIG. 4 illustrates a device packaged as a flip-chip. In this embodiment, the metallization layer 24, which is juxtaposed to the active layer 14, is bonded to the Au-plated Cu pedestal of the package stud 32 using an ultrasonic bonding technique. In another embodiment, the package stud may include a diamond heatsink embedded therein. A contact lead structure 26, which, in this illustrative embodiment, is two 0.001 inch diameter Au wires bonded in cross pattern, is bonded ultrasonically to the metallization layer 22. In another embodiment, other bonding techniques, such as thermal or compression bonding, can be utilized. The contact lead structure 26 is bonded to an Alumina ($Al_2O_3$) or Quartz ($SiO_2$) ring (34) of the package. During the bonding steps, the GaAs substrate outside the via provides mechanical support, so that the fragile InP is not damaged or destroyed. Thereafter, a wet chemical etchant having a substantially different etch rate with respect to substrate and active material is used to remove the GaAs material located between the upper metallization layer 22 and the InP buffer layer 12, exposing the metallization around the space created by formation of the via.

Finally, in order to prevent oxidation, the package is filled with hydrogen and the package is sealed. The structure as thus completed places the metallization layer deposited on the active layer 14 in direct thermal contact with the package pedestal 32, while the contact lead 26, which is in contact with the upper metallization layer 22, is connected directly to the rear of the buffer layer 12. This direct connection to the package pedestal and to the contact lead permits lowered parasitic electrical and thermal power loss, good heat dissipation and higher power of operation of the Gunn diode manufactured according to the invention.

Depending on the design requirements, multiple structures of the type shown in FIG. 4 can be placed in a single package or in an integrated circuit to increase the total device active area or to improve distribution of thermal or mechanical loads. This can be readily accomplished by appropriately dicing the structure, and since at the stage of manufacturing illustrated in FIG. 3 the surface of the entire wafer is metalized, the devices of each multiple structure are automatically connected in parallel. In general, smaller individual via holes would be used for such parallel-connected devices.

It will be appreciated that there has been described a method for manufacturing a Gunn diode which comprises an active layer of a difficult-to-work with material such as InP, while retaining the mechanical processing advantages of GaAs. In the ultimate Gunn diode structure, both sides of the active layer are connected to the device contacts without an intermediate layer of GaAs or another semiconductor substrate material. Therefore, a device manufactured more easily, according to this invention can reliably produce greater output power and/or higher efficiency.

As indicated, the method of this invention is not limited to manufacturing flip-chip style devices having an active and a buffer layer as shown in FIG. 4 wherein the active layer 14 is directly connected to the package pedestal 32. It should be noted that the buffer layer 12 can be absent in the device manufactured according to this invention, or the buffer layer can be arbitrarily thin. Various device configurations, which employ a via-connected metallization layer directly connected to an active or buffer layer of the device, can be manufactured according to the method of this invention when materials that have different sensitivity to a selected etchant are employed in device fabrication.

Figure 5:
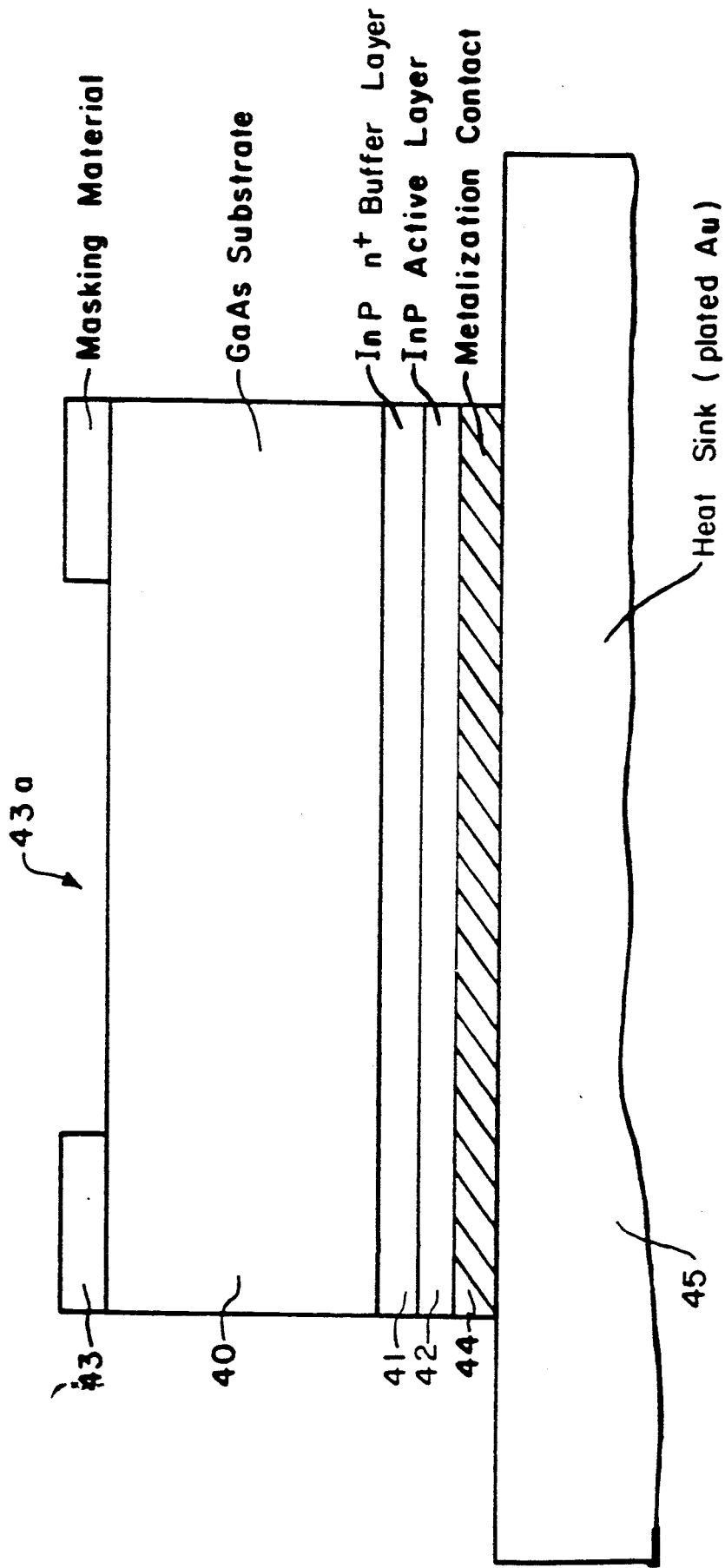
FIG. 5 is an illustration of a GaAs-InP layered structure fabricated according to the Integral Heat Sink (IHS) design.
Figure 6:
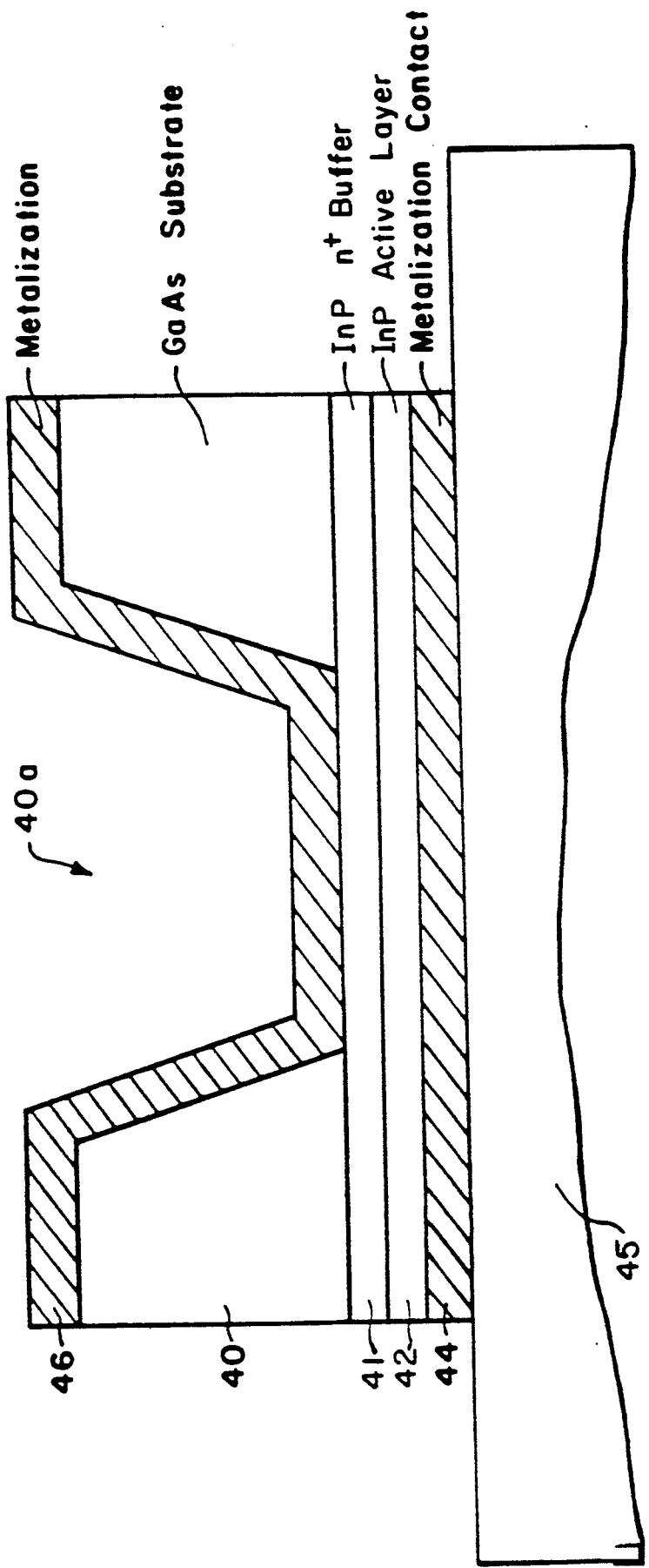
FIG. 6 is an illustration of the layered structure of FIG. 5 in which a via is formed and coated with metallization.
Figure 7:
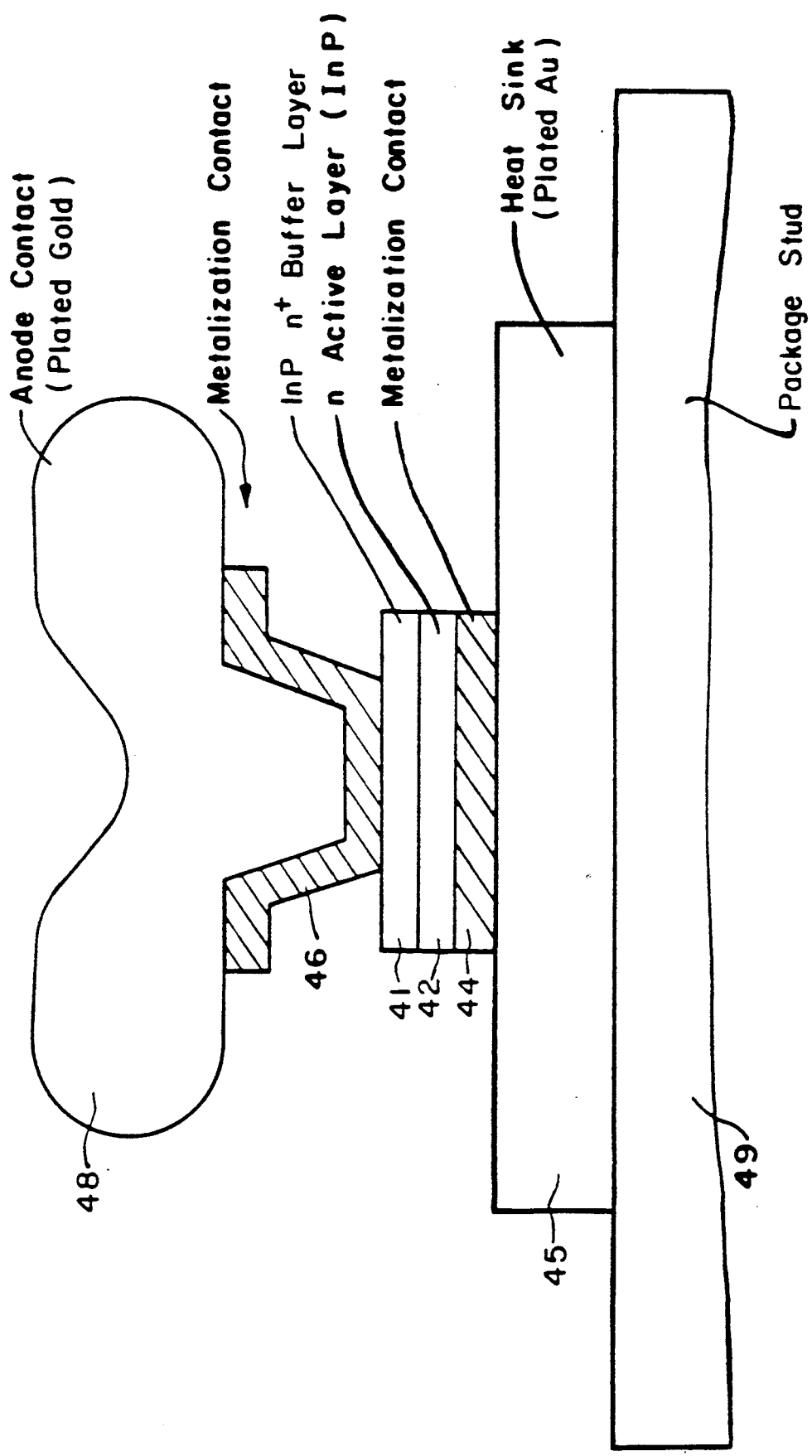
FIG. 7 is an illustration of an Integral Heat Sink (IHS) configuration of the Gunn diode manufactured according to the method of the invention.

For example, FIGS. 5-7 illustrate stages in manufacture of a plated Integral Heat-Sink (IHS) device. Specifically, FIG. 5 shows a layered structure which comprises a GaAs substrate 40, an n+ InP buffer layer 41 and an n doped InP active layer 42, which are epitaxially deposited on the substrate 40 using techniques discussed in conjunction with FIG. 1, a gold-plated heat sink 45, a metallization contact layer 44, which for example can be AuGeNi with or without additional Au layers formed thereupon, and a layer of a masking material 43. The masking material 43 is photoresist, silicon dioxide, or another conventional masking material. The masking material 43 is partially removed to define an area 43(a) for etching a via. This structure is similar to the structure described in conjunction with FIG. 1, except the contact 44, connected to the heat sink 45, is formed at the initial stage of manufacture. The plated heat sink configuration is preferred for some applications because an approximately 250 μm heat sink provides additional protection to the thin active layer during die bonding, and the die bonding process may be of higher yield than the flip-chip die bonding process. Note that the buffer layer 41 can be arbitrarily thin.

FIG. 6 illustrates a via 40a, which is etched in the GaAs substrate 40 under the opening in the masking material 40a using a reactive ion etch process as described in conjunction with FIG. 2. After etching of the via 40a, the masking material 43 (FIG. 5) is removed, and the via and the substrate surface are coated by a metallization layer 46, which is a conventional metallization material, such as AuGeNi with or without an additional Au layer 48 (FIG. 7) formed thereupon.

Next, as illustrated in FIG. 7, the wafer, which usually contains many identical devices, is cut or otherwise separated into dice. Thereafter, the heat sink 45 is bonded to the package stud 49 using reflow solder bonding or another appropriate bonding technique. The anode contact 46 or 48, where applicable, is typically connected to the device package using gold wires, or ribbons, or a preform. Finally, the GaAs substrate material 40 is removed using the selected etchant.

As indicated above, it will be appreciated by those skilled in the art that other combinations of substrate and active materials, which have different sensitivities to various etchants, could be employed in the process according to the invention. Accordingly, the method of this invention is applicable to fabrication of various semiconductor device structures manufactured from various materials.

Furthermore, the method of this invention is applicable to fabrication of devices that employ the same substrate and active materials, or substrate and active materials constructed from different materials but that have similar sensitivity to available etchants. Such improved devices are manufactured by growing an additional etch-stop layer in the layered structure formed at the initial stage of device manufacture.

Figure 8:
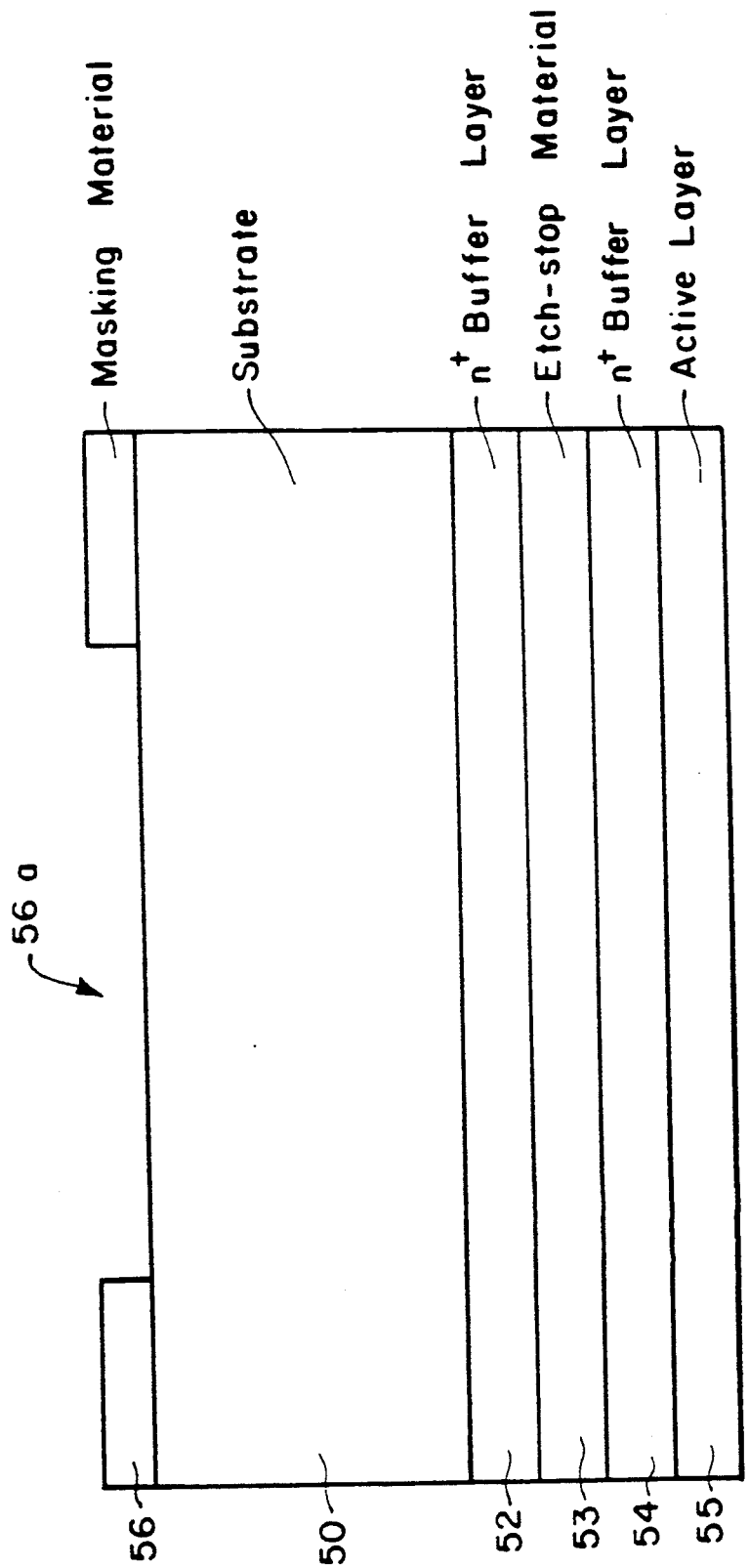
FIG. 8 is an illustration of a layered structure (which includes an etch stop layer) with masking material utilized in a different embodiment of the invention.
Figure 9:
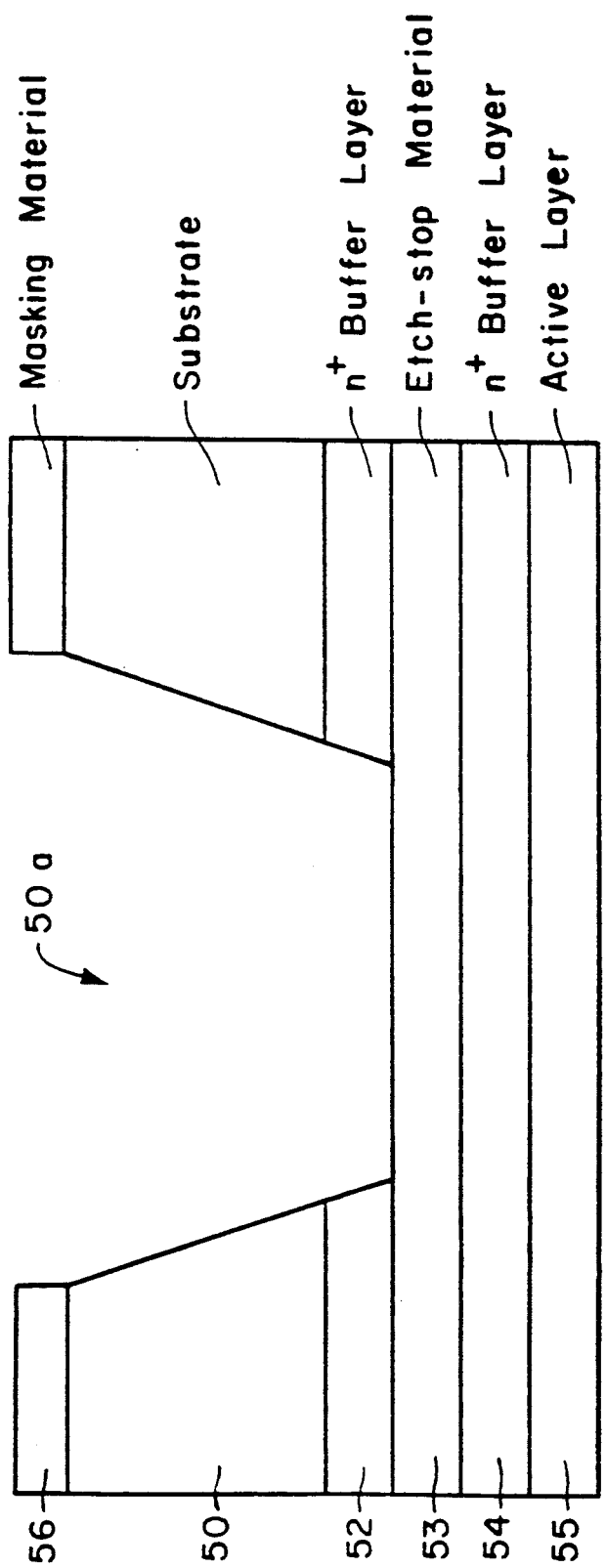
FIG. 9 is an illustration of the layered structure of FIG. 8 after etching a via through the GaAs layers without etching the etch-stop layer.
Figure 10:
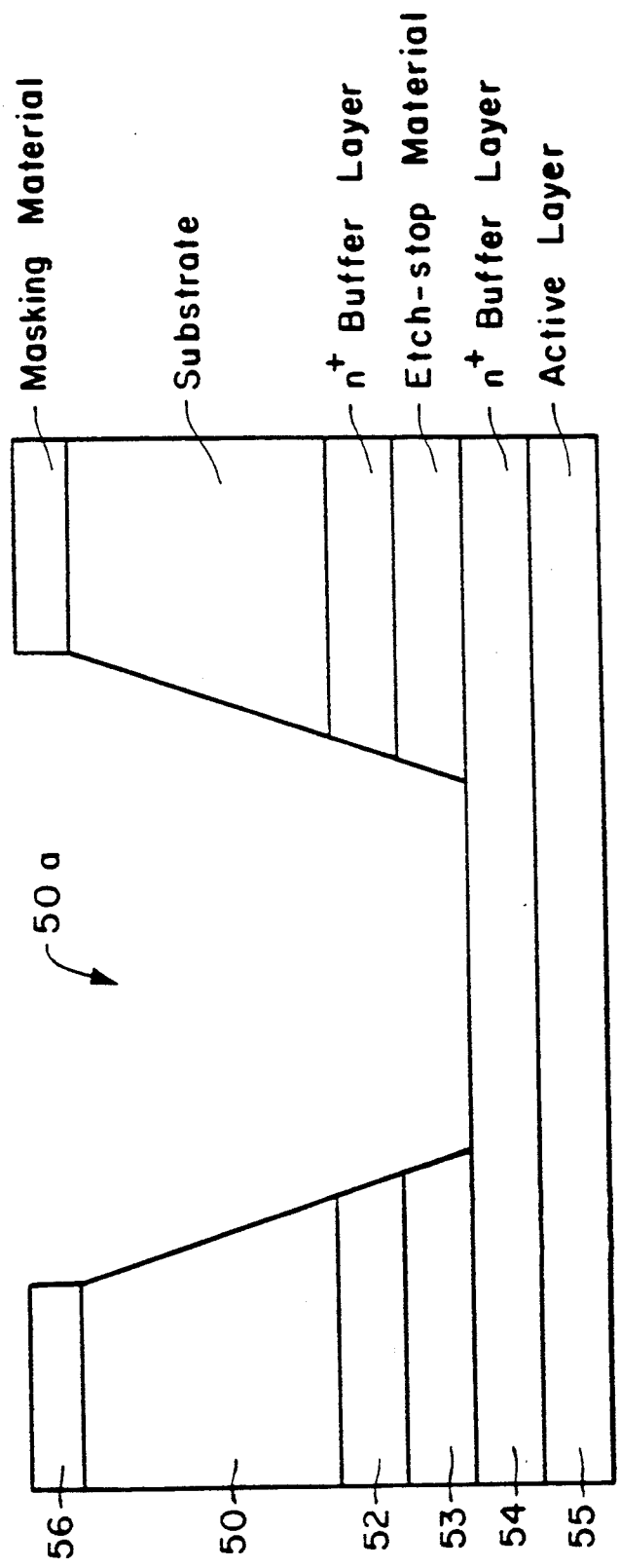
FIG. 10 is an illustration of the structure of FIG. 9 after etching a via through the etch-stop layer.

FIGS. 8–10 illustrate the steps of manufacturing of a GaAs Gunn diode which includes an etch-stop layer that permits formation of a via according to the method of this invention. Specifically, FIG. 8 shows a layered structure which consists of a GaAs substrate 50, an n+ doped GaAs buffer layer 52 grown on the substrate, an etch stop layer 53 (in this embodiment, illustratively, $Al_xGa_{1-x}As$, preferably $Al_{0.3}Ga_{0.7}As$) which is epitaxially grown on the buffer layer 52, another n+ doped GaAs buffer layer 54 grown on the etch-stop layer 53, and an n doped GaAs active layer 55 grown on the buffer layer 54. Masking material 56, such as photoresist or silicon dioxide, which contains openings 56(a) for devices to be formed on the layered structure, is provided as discussed in conjunction with FIG. 1. The etch rates of the $Al_{0.3}Ga_{0.7}$. As etch-stop layer 53 and the GaAs layers (50 and 52) are different with respect to certain etchants. The difference in etch rates, which may be as high as about 500:1, can be achieved if a mixture of Cl- and/or F-containing gas is used as an etchant. An enabling disclosure of this technique is provided in the article by Cooper et al., previously mentioned and incorporated by reference herein.

Figure 11:
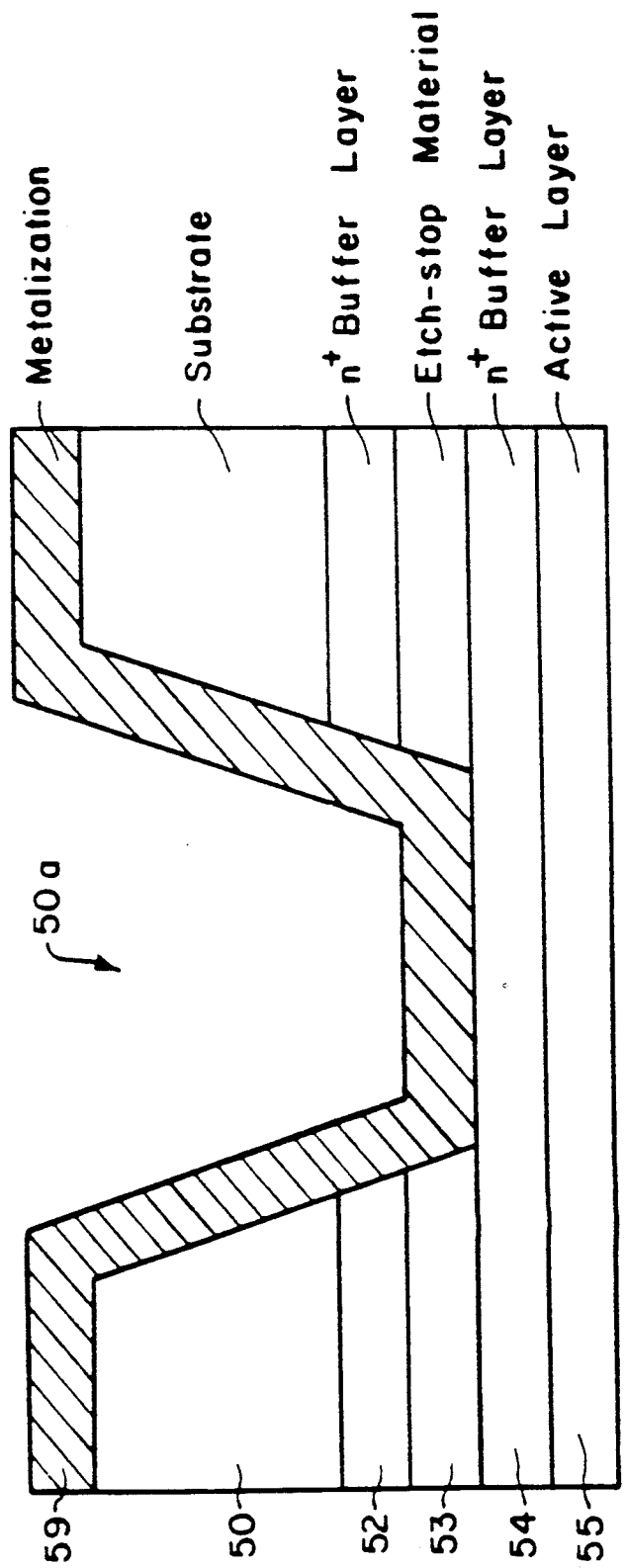
FIG. 11 is an illustration of the layered structure of FIG. 10 with the masking material removed and the via metalized.

Accordingly, at the next step of manufacture, a via 50(a), illustrated in FIG. 9, is formed in GaAs layers 50 and 52 without affecting the etch-stop layer 53 significantly. A direct via connection to the thin etch stop layer would improve the electrical characteristics of the resultant device. However, typically a second selective etch is then used to etch through the etch-stop layer 53 without affecting the underlying GaAs layers (54 and 55. FIG. 10 illustrates the via 50(a) extended to the surface of the buffer layer 54 by etching through the etch-stop layer 53. As in the previously described embodiments of the invention, the masking material 56 is removed and the substrate surfaces, including the via 50(a), are metalized, for example, using AuGeNi or another metallization material as illustrated in FIG. 11. The metalized via contact 59 provides a connection to the active layer 55 through the buffer 54 layer. Although, in this embodiment of the invention, some of the substrate material is still present in the resultant device, the electrical characteristics of the device are improved due to the direct via connection to the buffer layer 54. The device manufactured according to this invention can be packaged in a flip-chip or plated heat sink configuration, as described previously.

As indicated previously, the method of this invention is not limited to fabrication of Gunn diodes; therefore, other semiconductor devices, uses, and applications are within the scope of this invention. Any discrete semiconductor device requiring a minimum of substrate-related electrical and/or thermal resistance can benefit from this invention. For example, an Impact Avalanche Transit Time (IMPATT) diode, which is typically useful for high-power solid state microwave and millimeter wave applications, is a direct beneficiary. The physical structure of an IMPATT diode is very similar to a Gunn diode, differing primarily in the structure of the device active layer and any semiconductor contact layers used. Thus, the method of the preferred embodiment that involves etching a via hole through the substrate for attaching a device contact is also applicable to manufacturing the improved IMPATT diodes.

Furthermore, in millimeter-wave or submillimeter-wave devices, it is important to reduce not only thermal and DC electrical resistance, but also the parasitic RF electrical resistance due to the skin effect, which can be improved using the method of this invention. For example, a submillimeter-wave point-contact Schottky mixer diode with a 1 μm diameter anode, operated at a frequency of 500 GHz, may have a spreading resistance beneath the anode which is three times greater than that calculated from strictly DC considerations. The parasitic electrical series resistance can be usefully reduced in a device manufactured according to this invention.

Illustratively, other types of devices that can be improved if manufactured according to the method of this invention are millimeter-wave and submillimeter wave multiplier and parametric amplifier (paramp) Varactor diodes. These devices are subject to the same RF parasitic series resistance as the aforementioned point-contact Schottky mixer diode. In addition, they also may have to dissipate substantial thermal loads and overall power output of such devices is often limited by the device's power dissipation capability. In such devices manufactured according to the method of this invention, the device electrical parasitic series resistance and the overall power dissipation are reduced. By allowing the device to operate at a lower junction temperature, improved performance, in the form of higher output power, greater efficiency, and/or lower noise output, can be achieved.

As indicated above, it will be appreciated by those skilled in the art that other combinations of materials, which have different sensitivities to various available etchants, can be employed in the process according to the invention and various devices can be manufactured according to the method of this invention. Accordingly, the claims which follow are to be interpreted to cover all such equivalent structures and methods. The invention is thus not to be limited by the above exemplary disclosure, but only by the following claims.

I claim:

1. A method of forming a semiconductor device comprising the steps of:
   applying a first semiconductor material to a first side of a second semiconductor material, the first and the second semiconductor materials having different etch rates with respect to an etchant material;
   applying masking material to a second side of the second material, the masking material having at least one aperture therein;
   etching away the second material beneath the aperture in the masking material, to create a via extending through the second material to a surface of the first material;

metallizing the second side of the second material, so as to create a metallization layer that extends inwardly along the walls of the via and contacts the surface of the first material; and etching away the second material external to the via.

2. The method of claim 1 wherein the first semiconductor material is InP and the second semiconductor material is GaAs.

3. The method of claim 1 wherein the first semiconductor material comprises an n doped active layer and an n+ doped buffer layer.

4. The method of claim 1 wherein the first semiconductor material is an etch-stop layer.

5. The method of claim 4 wherein the first semiconductor material is $Al_xGa_{1-x}As$ and the second semiconductor material is GaAs.

6. The method of claim 1 wherein the etching step is performed by reactive ion etching.

7. The method of claim 6 wherein the etching is performed with a gas containing Cl- or F-.

8. The method of claim 1 further comprising the step of bonding the semiconductor device into a package.

9. The method of claim 8 wherein the step of bonding is ultrasonic bonding.

10. The method of claim 8 wherein the step of bonding is thermal bonding.

11. The method of claim 8 wherein the step of bonding is reflow solder.

12. The method of claim 8 wherein the step of bonding is compression bonding.

13. A method of forming a Gunn diode, comprising the steps of:

applying an n+ doped buffer layer of a first semiconductor material to a first side of a planar substrate of a second semiconductor material of similar crystalline dimensions using an epitaxial deposition technique to create a heterojunction, the substrate and the first semiconductor material having different etch rates with respect to an etchant material;

applying an n doped active layer of the first semiconductor material over the buffer layer, using an epitaxial deposition technique;

applying a masking material to a second side of the planar substrate, the masking material having at least one aperture therein;

etching away the substrate beneath the aperture in the masking material, to create a via extending through the second material to a surface of the buffer layer;

metallizing the second side of the substrate, so as to create a first metallization layer on the second side of the substrate that extends inwardly along the walls of the via and contacts the buffer layer; and etching away the substrate material external to the via.

14. The method of claim 13, further comprising the step of metallizing the active layer, so as to create a second metallization layer.

15. The method of claim 14 wherein the first semiconductor material of the buffer and active layers is InP and the second semiconductor material of the substrate is GaAs.

16. The method of claim 13 wherein the etching step is performed by reactive ion etching.

17. The method of claim 16 wherein the etching is performed with a gas containing Cl- or F-.

18. The method of claim 13 wherein the first metallization layer is formed from AuGeNi.

19. The method of claim 13 further comprising the step of removing the masking material.

20. The method of claim 13 further comprising the step of bonding the Gunn diode into a package.

21. The method of claim 20 wherein the step of bonding is ultrasonic bonding.

22. The method of claim 20 wherein the step of bonding is thermal bonding.

23. The method of claim 20 wherein the step of bonding is compression bonding.

24. The method of claim 20 wherein the step of bonding is reflow solder.

* * * * *